United States Patent [19]

Asmussen et al.

[11] Patent Number: 5,081,398

[45] Date of Patent: Jan. 14, 1992

[54] RESONANT RADIO FREQUENCY WAVE COUPLER APPARATUS USING HIGHER MODES

[75] Inventors: Jes Asmussen, Okemos; Jeffrey A. Hopwood, Haslett, both of Mich.

[73] Assignee: Board of Trustees operating Michigan State University, East Lansing, Mich.

[21] Appl. No.: 424,720

[22] Filed: Oct. 20, 1989

[51] Int. Cl.$^5$ .............................................. H05H 1/18
[52] U.S. Cl. ........................ 315/111.41; 315/111.21; 315/111.71; 315/111.81; 313/231.31
[58] Field of Search ................... 315/111.21, 111.41, 315/111.71, 111.81; 313/231.31

[56] References Cited

U.S. PATENT DOCUMENTS

| | | | |
|---|---|---|---|
| 4,507,588 | 3/1985 | Asmussen et al. ................. | 315/39 |
| 4,585,668 | 4/1986 | Asmussen et al. ......... | 315/111.81 X |
| 4,630,566 | 12/1986 | Asmussen et al. ......... | 315/111.41 X |
| 4,713,585 | 12/1987 | Ohno et al. ................. | 315/111.21 X |
| 4,727,293 | 2/1988 | Asmussen et al. .............. | 315/111.41 |
| 4,745,337 | 5/1988 | Pichot et al. ................ | 315/111.21 X |
| 4,940,015 | 7/1990 | Kobashi et al. ............. | 315/111.21 X |
| 4,947,085 | 8/1990 | Nakanishi et al. ............. | 315/111.41 |

Primary Examiner—Eugene R. LaRoche
Assistant Examiner—Do Hyun Yoo
Attorney, Agent, or Firm—Ian C. McLeod

[57] ABSTRACT

An improved apparatus for generating a uniform electron cyclotron resonance (ECR) region in a plasma region (16) of a chamber (15) is described. The apparatus uses higher modes of electrical field cusps (16b) which are essentially perpendicular to the magnetic field cusps (16a) in a controlled manner to produce the ECR. The modes are optimal in the ECR region.

21 Claims, 12 Drawing Sheets

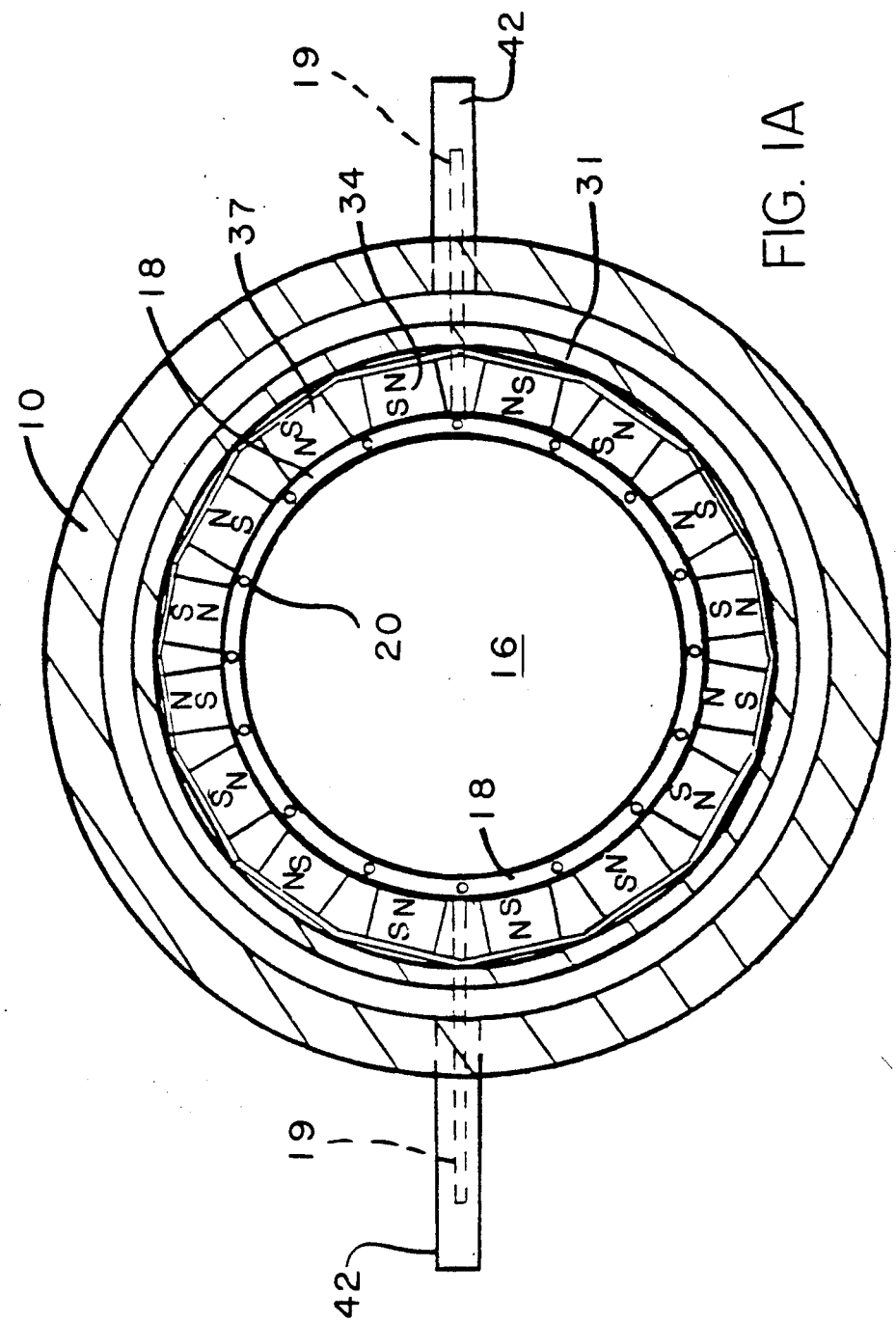
FIG. IA

RESONANT RADIO FREQUENCY WAVE COUPLER APPARATUS USING HIGHER MODES

BACKGROUND OF THE INVENTION (1) Field of the Invention

The present invention relates to an improved resonant radio frequency wave coupler apparatus for creating and maintaining uniform electron cyclotron resonance (ECR) in a low pressure plasma. In particular, the present invention relates to an apparatus where magnetic fields are essentially perpendicular to electric fields of higher modes so as to create and maintain uniform ECR at low pressures and more particularly to an apparatus which creates a plasma with a large processing surface area.

(2) Prior Art

U.S. Pat. No. 4,727,293 to Asmussen, Reinhard and Dahimene describes a resonant radio frequency wave coupler apparatus which creates and maintains ECR. In this apparatus no attempt was made to optimally match the static magnetic and microwave electric fields in any particular manner. The problem was to provide an improved apparatus with more uniform ECR.

OBJECTS

It is therefore an object of the present invention to provide an apparatus which creates uniform ECR. Further, it is an object of the present invention to provide an apparatus which is relatively simple to construct and operate. These and other objects will become apparent from the following and the drawings.

IN THE DRAWINGS

FIG. 1 is a front cross-sectional view of the improved radio frequency wave coupling apparatus wherein gas feed tubes 19 feed gas into the plasma region 16 of the chamber 15 through inlets 20 which are adjacent to each magnet 34.

Figure 1:
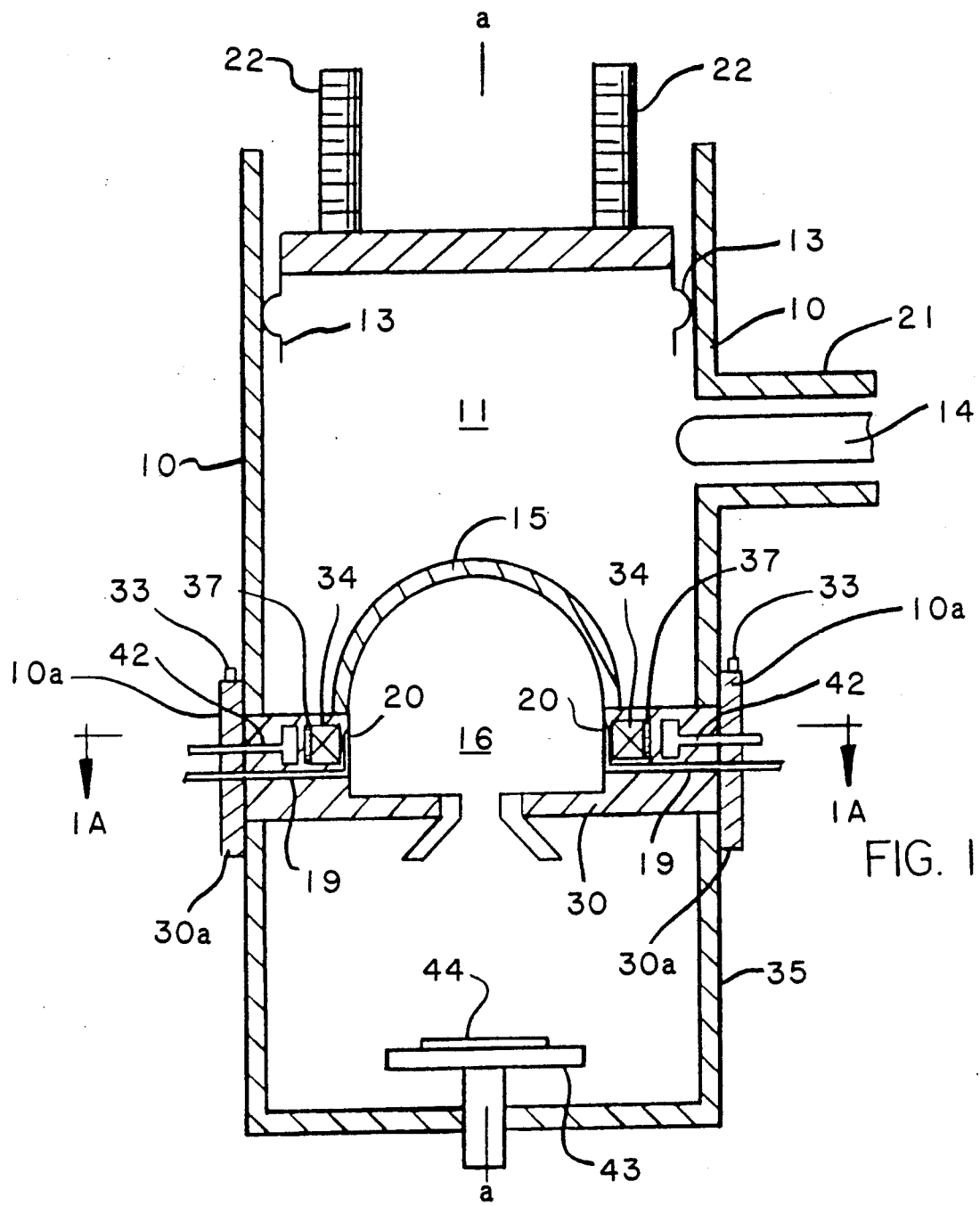
FIG. 1A is a plan cross-sectional view along line 1A—1A of FIG. 1 showing the plasma region 16.
Figure 2:
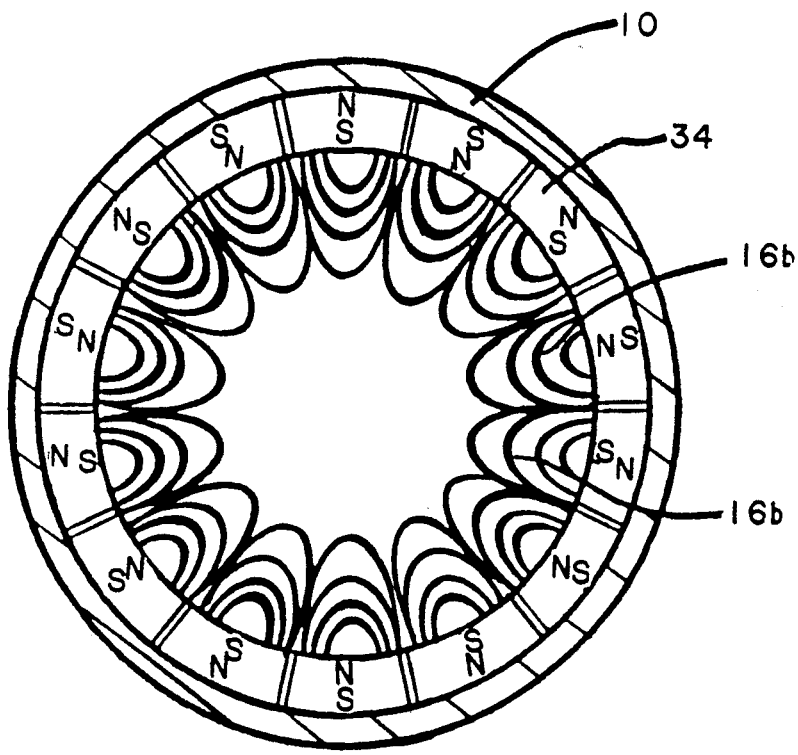
FIG. 2 is a plan cross-sectional view of higher mode microwave electric field lines or cusps 16b for the $TE_{71}$ mode exciting the plasma region 16 of the apparatus of FIG. 1.
Figure 2A:
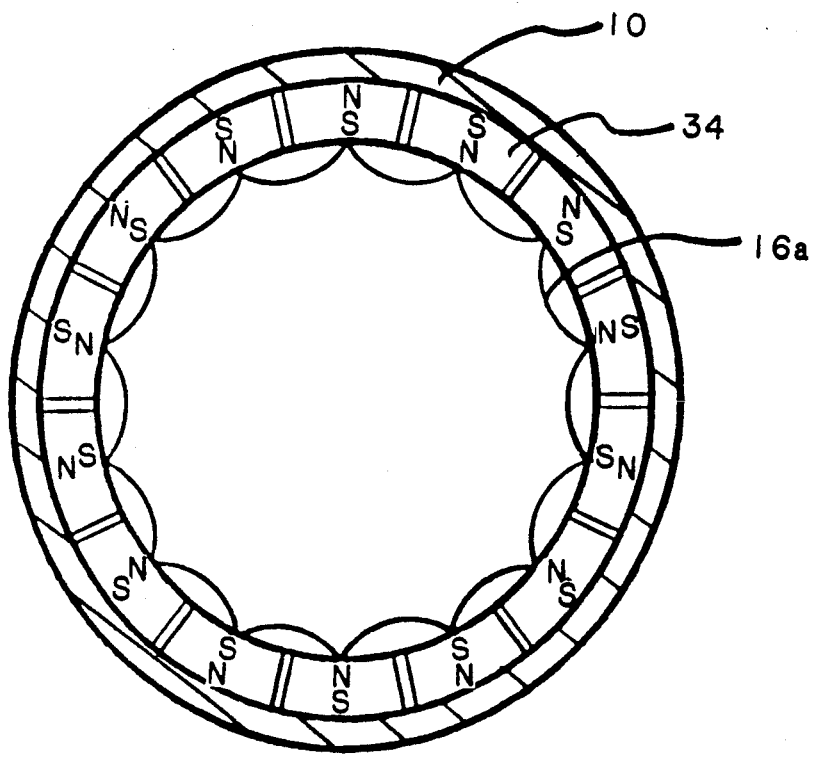

FIG. 2A is a plan cross-sectional view of the static magnetic field lines 16a in the plasma region 16 of the apparatus of FIG. 1. The magnetic field lines 16a are to be positioned to be essentially perpendicular to the electrical field lines 16b in the chamber 15 to produce ECR in a plasma.

Figure 3:
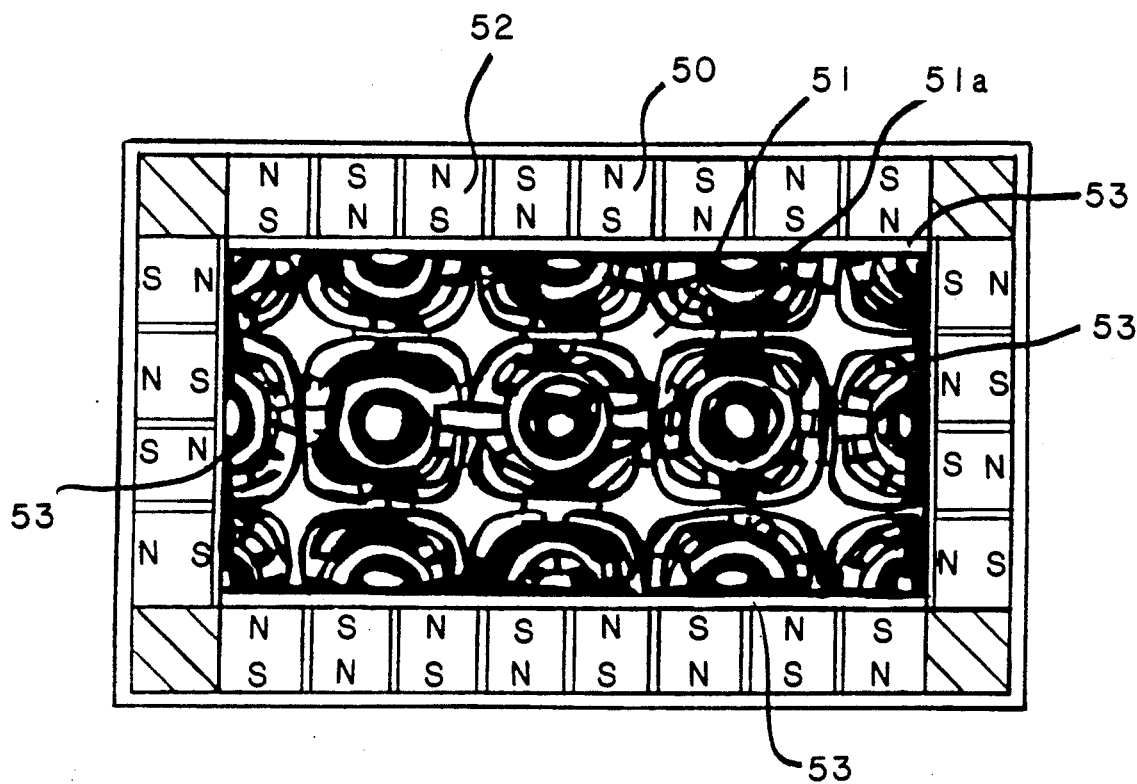

FIG. 3 is a plan cross-sectional view of a rectangular cavity 51 in an apparatus showing the microwave electric field cusps 51a for the $TE_{42}$ mode in the apparatus which are essentially perpendicular to the magnetic field cusps 51b.

Figure 3A:
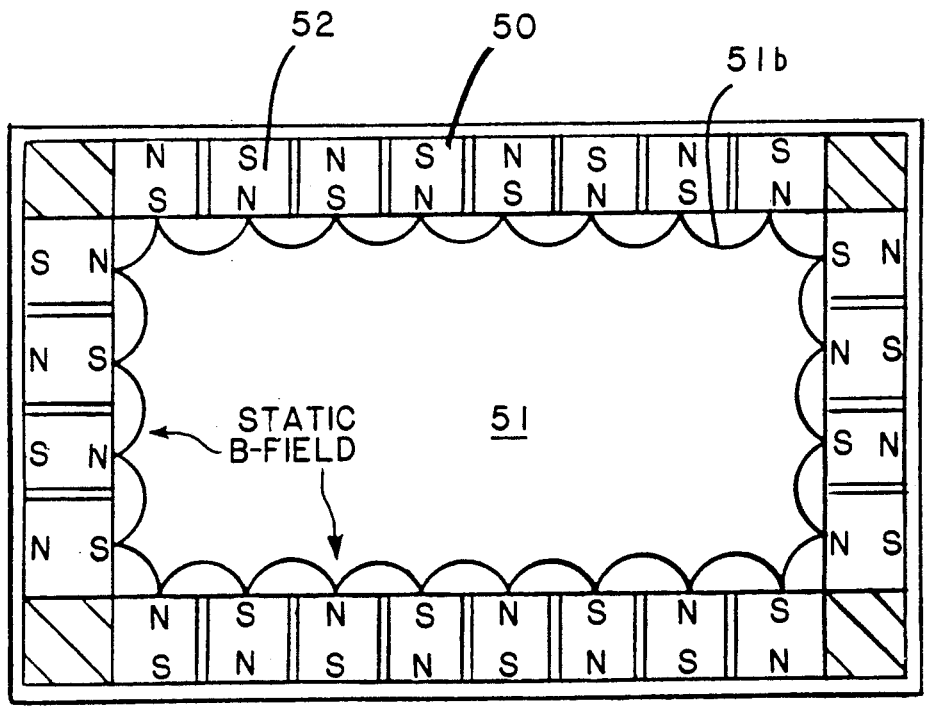

FIG. 3A is a plan cross-sectional view through the rectangular apparatus 51 of FIG. 3 showing the magnetic field cusps 51b.

Figure 4:
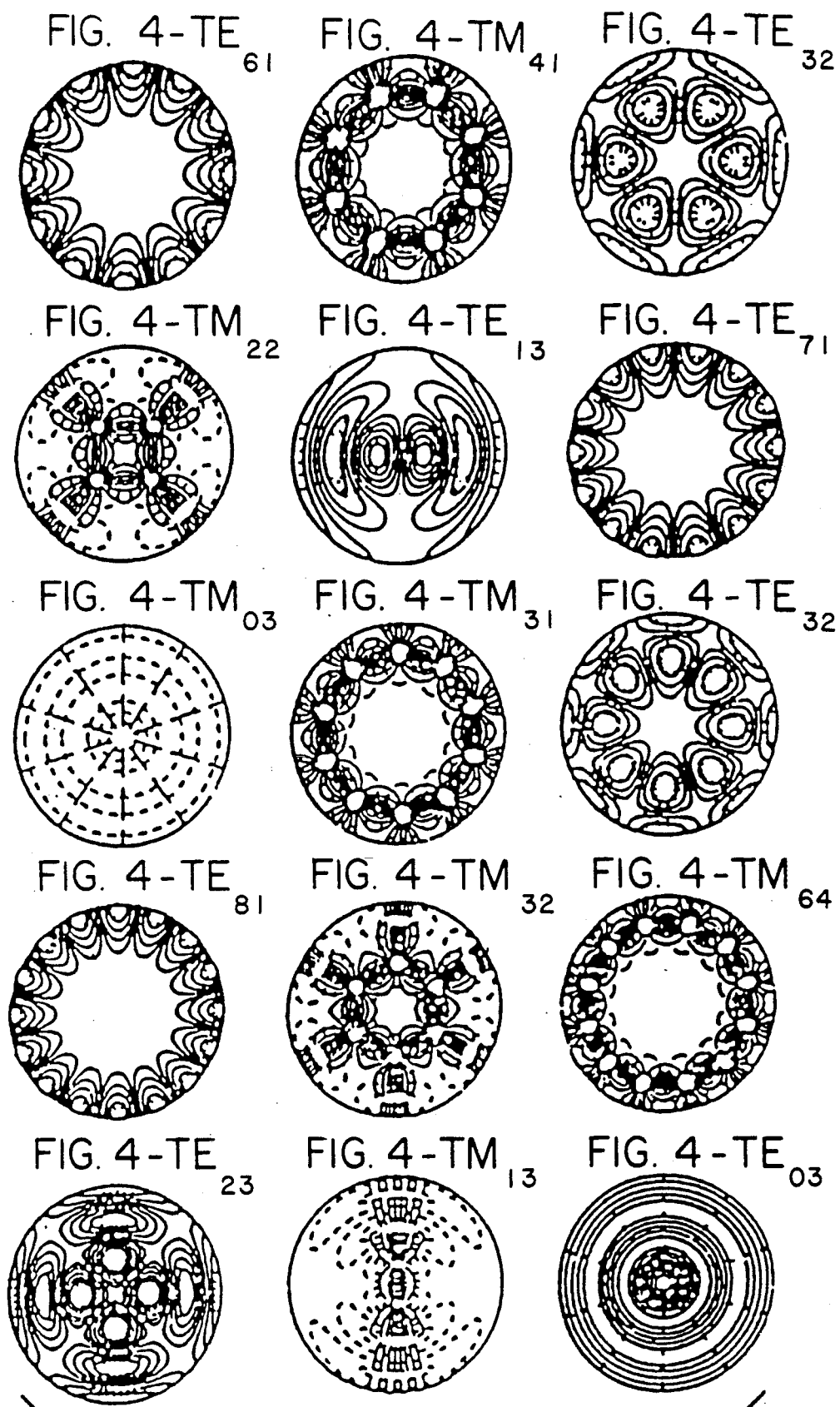

FIG. 4 shows various higher modes in a cross-section of empty circular cavity of an apparatus as shown in FIG. 1. As can be seen, FIG. 2 shows the $TE_{71}$ mode.

Figure 5:
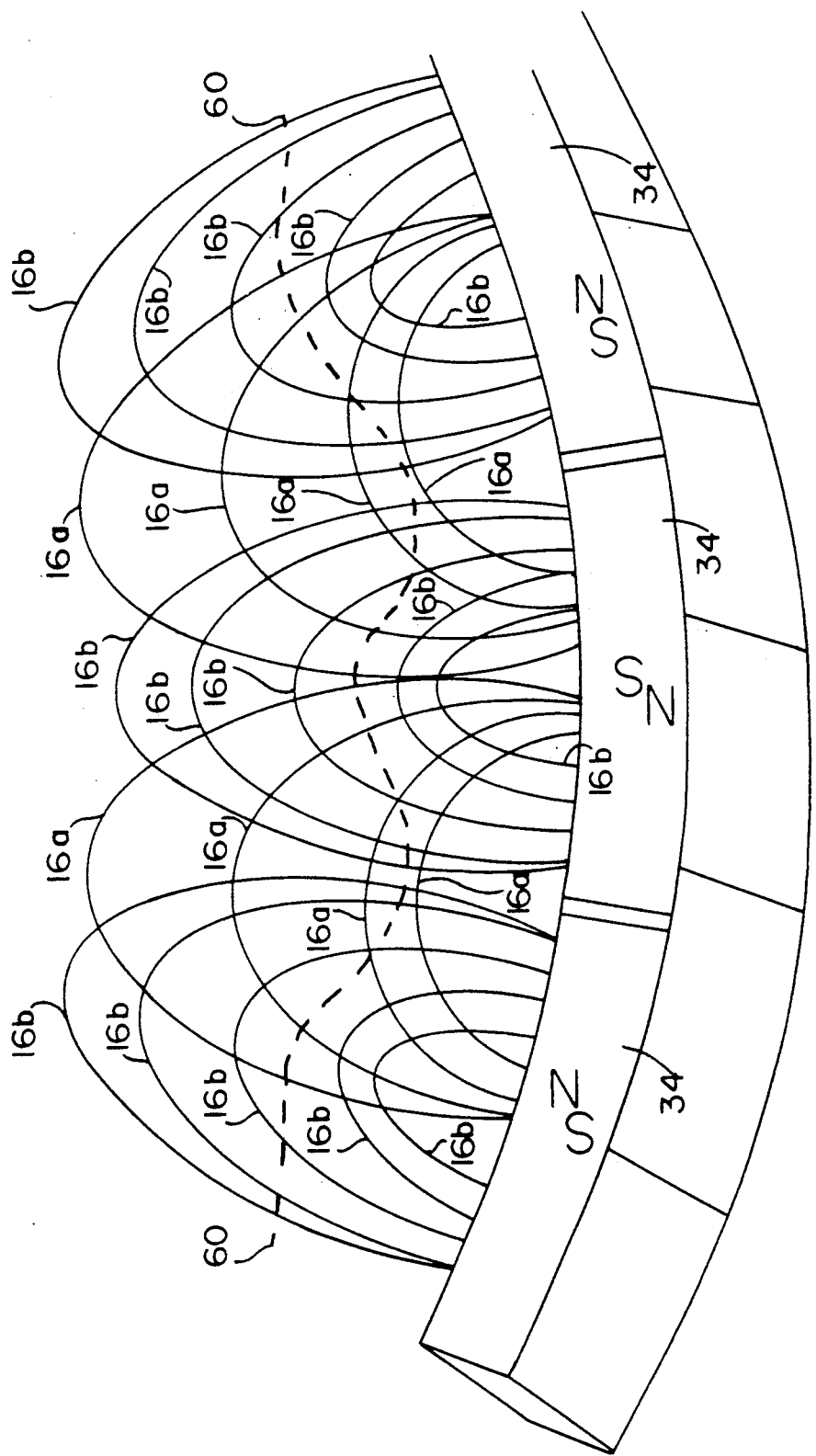

FIG. 5 is a schematic perspective view of a section of the magnets 34 showing the overlapping of the electric field cusps 16b and the static magnetic field cusps 16a. The result is that the microwave electric fields and the static magnetic fields are everywhere essentially perpendicular in the ECR region. This produces an accelerating force on the electrons over the entire ECR surface 60 in the plasma.

Figure 6:
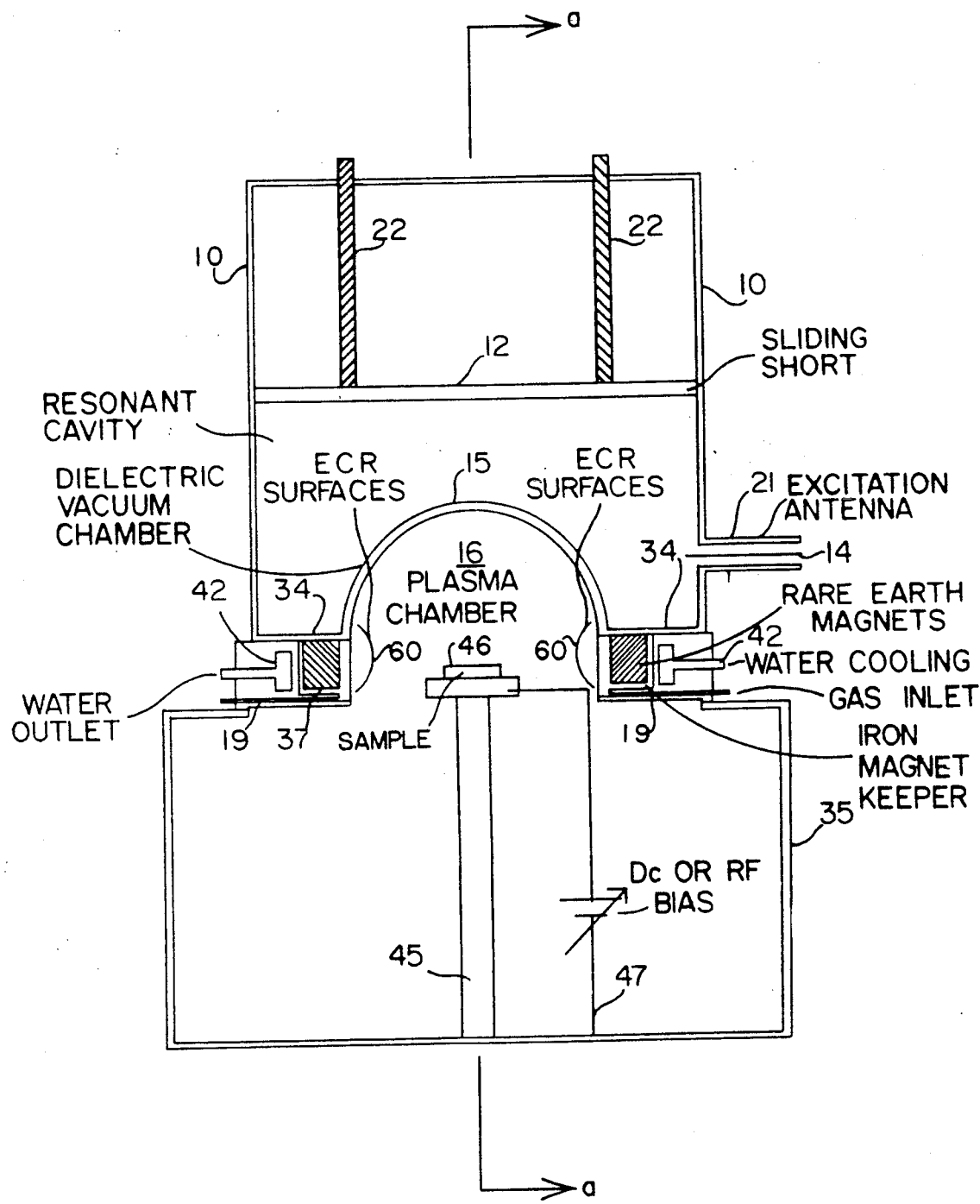

FIG. 6 is a front cross-sectional view of a resonant radio frequency wave generating apparatus for processing a substrate 46 in plasma region 16 of the chamber 15.

Figure 7:
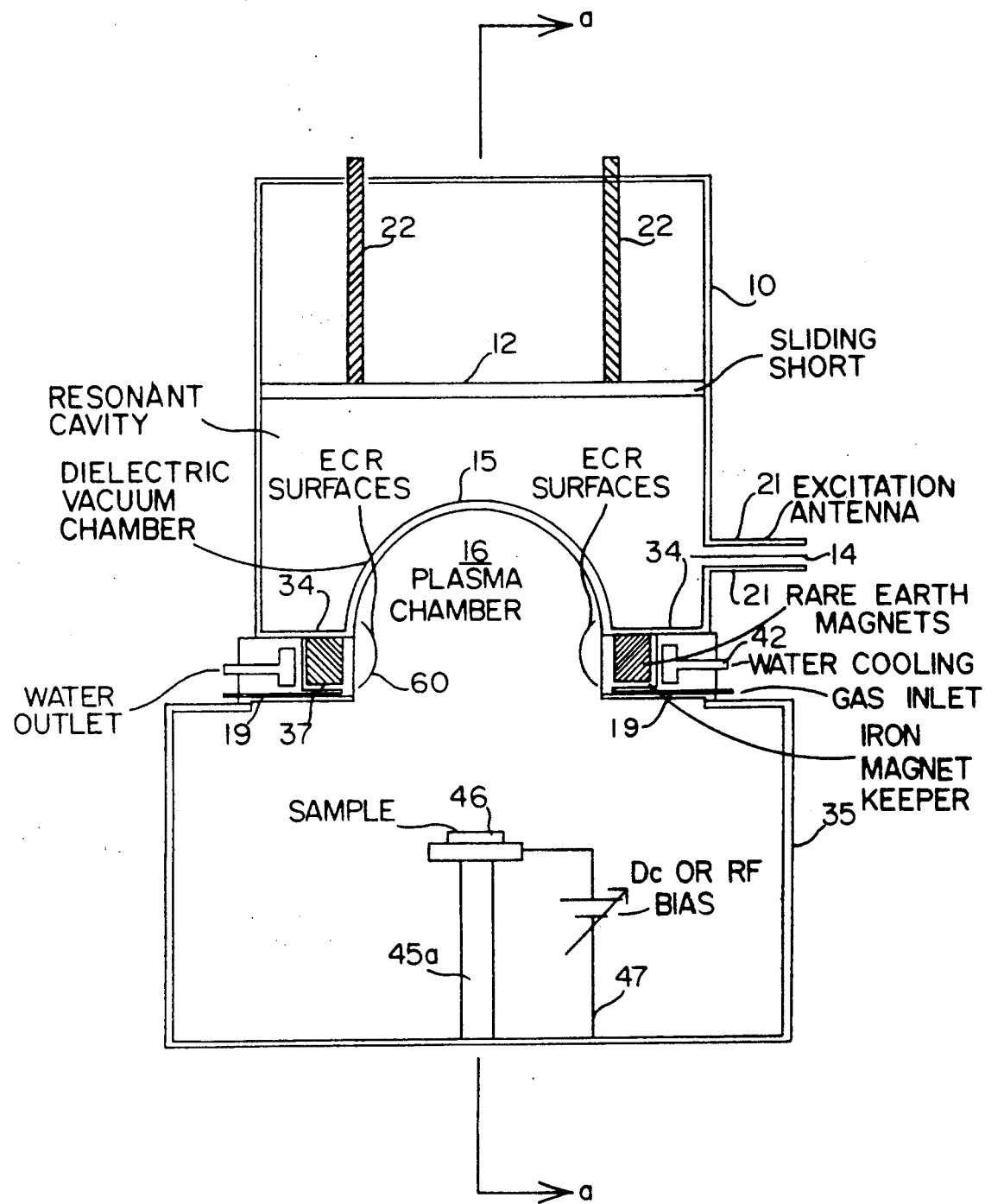

FIG. 7 shows the same apparatus as FIG. 6 wherein the substrate 46 to be treated is outside of the plasma region 16.

Figure 8:
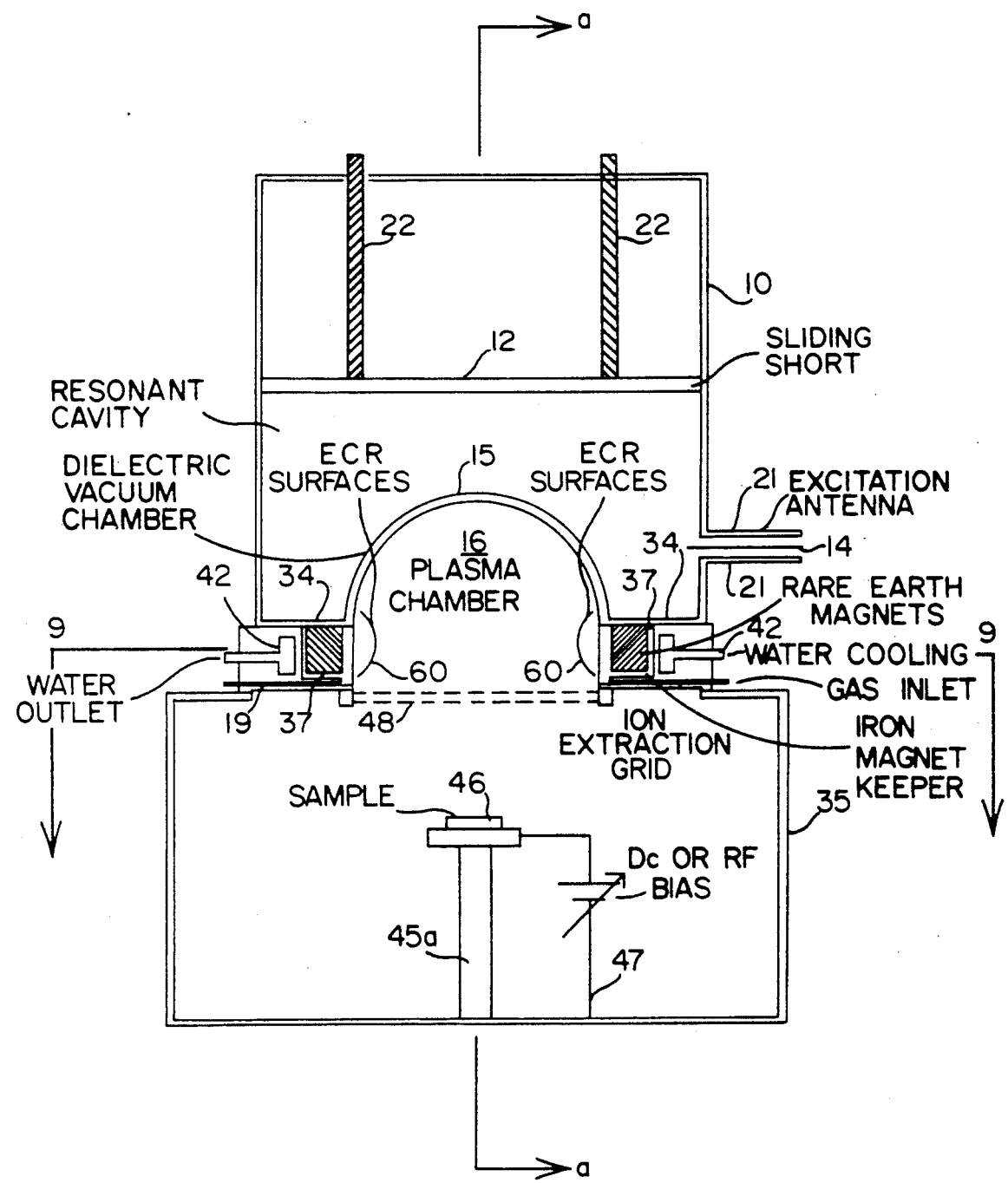

FIG. 8 is a front cross-sectional view of the apparatus shown in FIG. 6 with double accelerating grids or screens for accelerating ions from the plasma onto the substrate 46.

Figure 9:
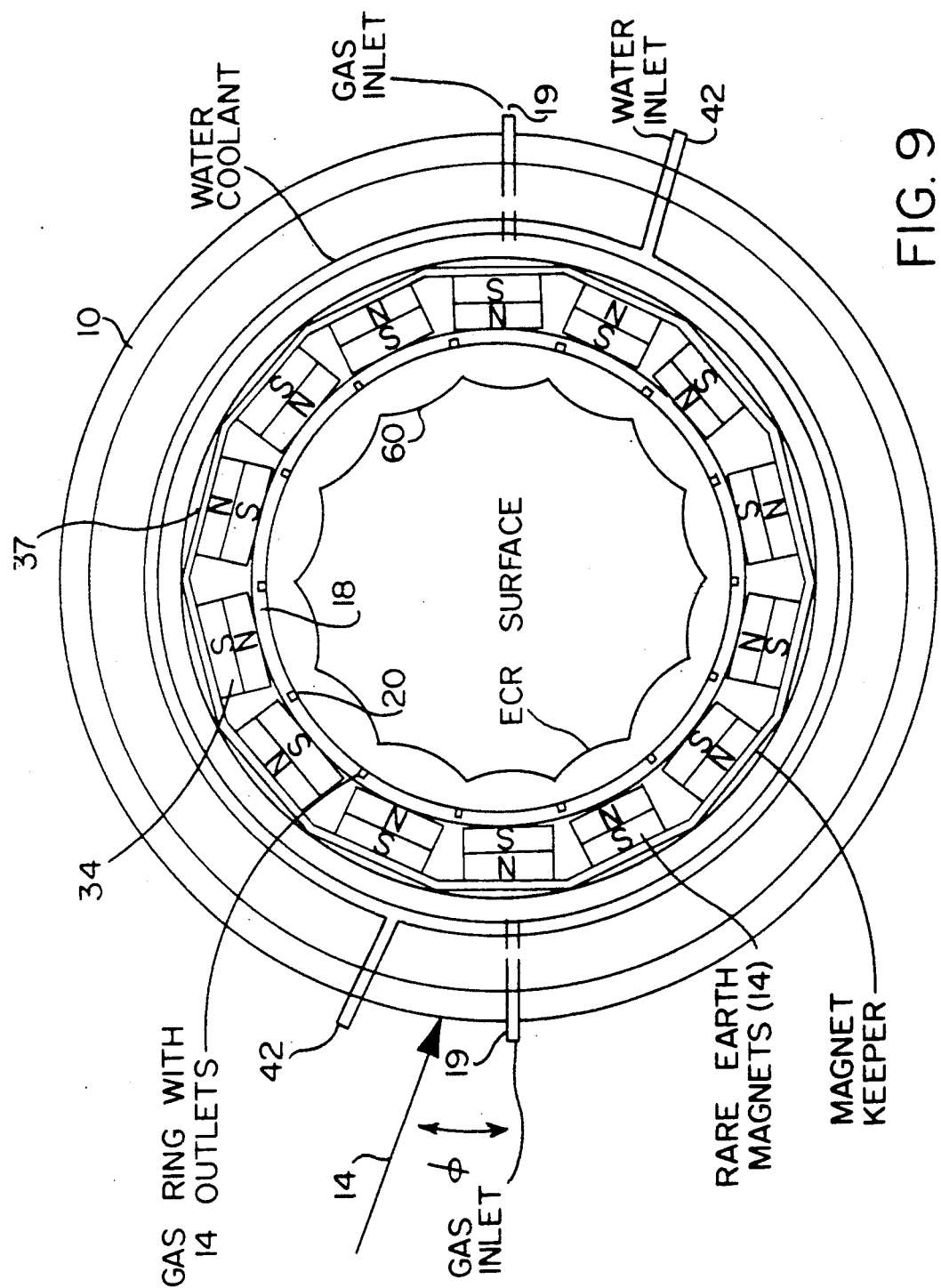

FIG. 9 is a plan cross-sectional view along line 9—9 of FIG. 8. The angle $\phi$ of the magnets 34 is changed relative to the antenna 14 shown by the position of the arrow.

Figure 10:
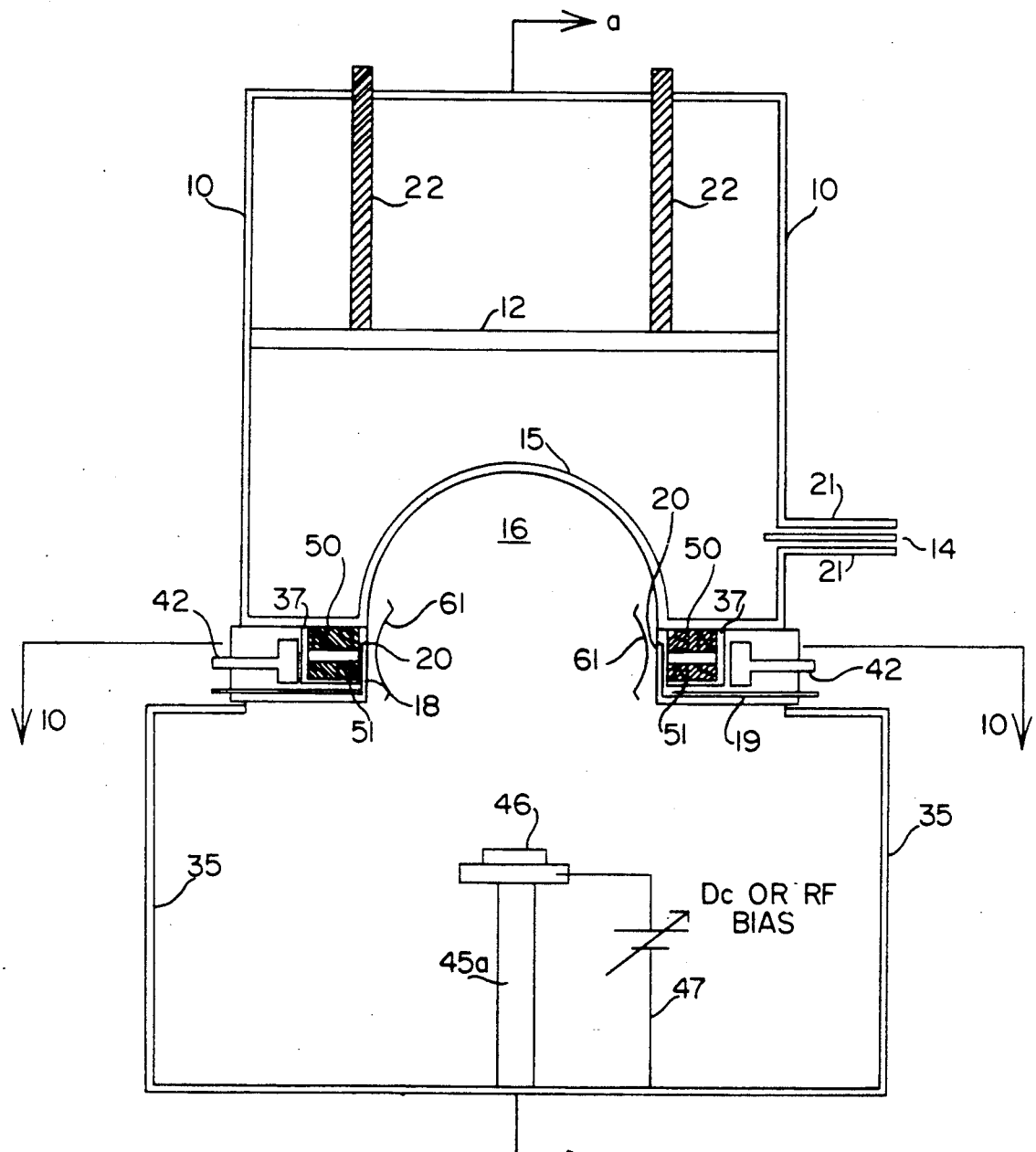

FIG. 10 is a front cross-sectional view of an apparatus wherein spaced apart rings of magnets 50 and 51 are used to generate ECR 61 in the plasma region 16 of the chamber 15.

Figure 11:
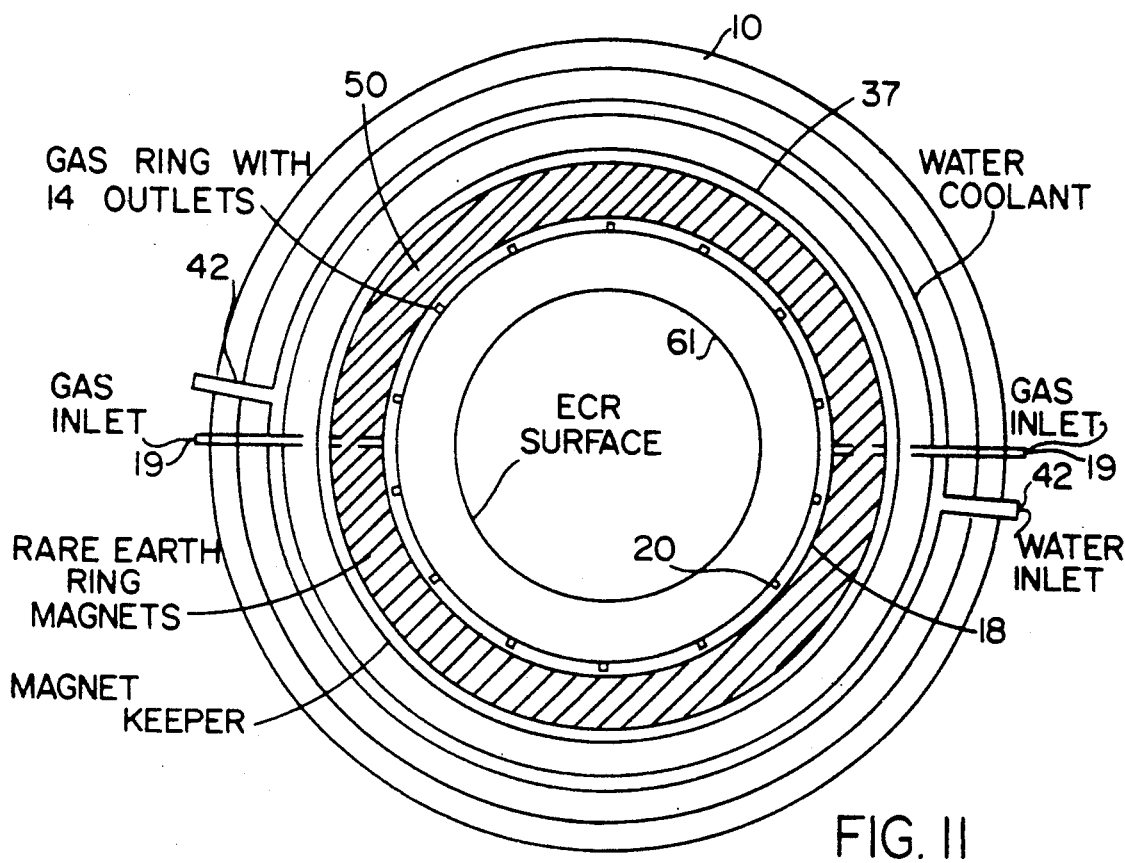

FIG. 11 is a plan cross-sectional view along line 10—10 of FIG. 10.

Figure 12:
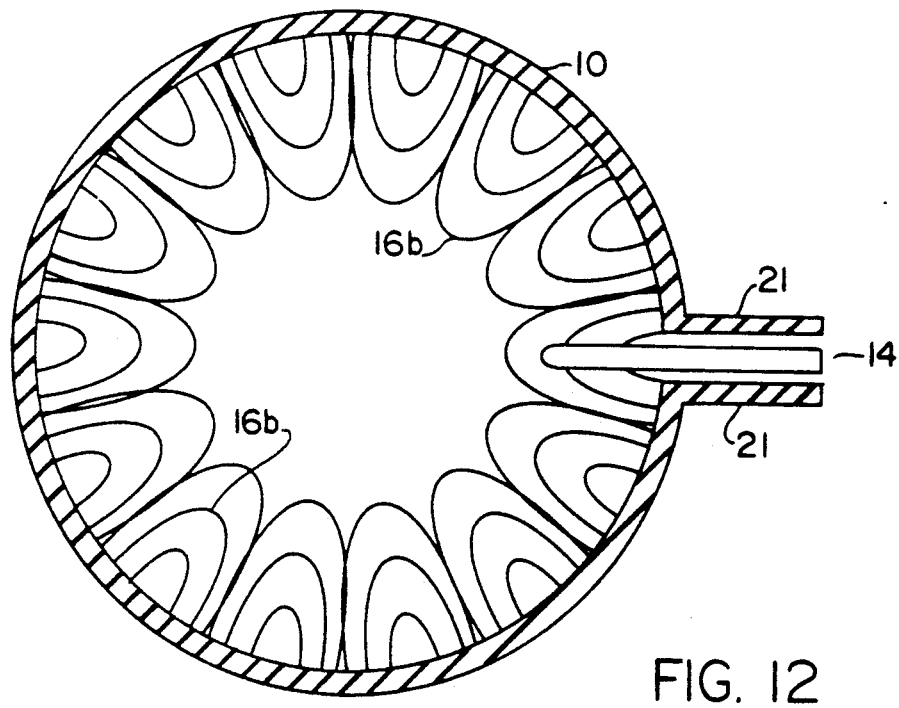

FIG. 12 is a plan view of the apparatus of FIG. 1 showing the position of the electric field cusps 16b relative to an antenna 14 which couples the field into the plasma region 16.

GENERAL DESCRIPTION

The present invention relates to a plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a probe connected to and extending inside the coupler for coupling the radio frequency waves to the coupler, wherein the radio frequency wave applied to the coupler creates and maintains the plasma at reduced pressures perpendicular to and surrounding the central longitudinal axis in the chamber, the improvement which comprises: a spaced apart magnet means mounted on the apparatus around the longitudinal axis of the chamber with N and S poles so as to create static magnetic field cusps in the chamber between the poles which aid in confining the plasma in the chamber; gas supply means adjacent to the magnet means for providing a gas in the chamber which is ionized to form the plasma in the chamber; and a radio frequency wave generator which generates higher mode microwave electric field cusps in the chamber so as to provide the electric field cusps and magnetic field cusps which overlap in the chamber to provide the electric field essentially perpendicular to the static magnetic field completely over an electron cyclotron resonance region in the plasma in the chamber in operation of the apparatus.

Further, the present invention relates to a method for creating a plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a probe connected to and extending inside the coupler for coupling the radio frequency waves to the coupler wherein reduced pressures are maintained, wherein the radio frequency wave applied to the coupler creates and maintains the plasma at reduced pressures perpendicular to and surrounding the central longitudinal axis in the chamber, the improvement which comprises: a spaced apart magnet means mounted on the apparatus around the longitudinal axis of the chamber with N and S poles so as to create static magnetic field cusps in the chamber between the poles which aid in confining the plasma in the chamber; gas supply means for providing a gas in the chamber which is ionized to form the plasma in the chamber; and a radio frequency wave generator which generates higher mode microwave electric field cusps in the chamber so as to provide the electric field cusps and magnetic field cusps which overlap in the chamber to provide the electric field essentially perpendicular to the static magnetic field completely over an electron cyclotron resonance region in the plasma in the chamber in operation of the apparatus; and creating a plasma in the chamber by introducing the gas into the chamber from the gas supply means at reduced pressure and providing the electron cyclotron resonance region in the chamber.

ECR coupling takes place when the exciting sinusoidal electric field $$\vec{E} = \vec{E}_o e^{j\omega t}$$

is:
(1) perpendicular to the static magnetic field
(2) $\omega = \omega_{ce}$ = electron cyclotron frequency = $eB/M_e$ (where e = charge of an electron, B = strength of a static magnetic field, $m_e$ = mass of an individual electron, and $\omega$ = excitation frequency)
(3) $\nu_e < < \omega = \omega_{ce}$
(where $\nu_e$ = the effective collision frequency for electrons)

In practice, ECR discharges make use of non-uniform static magnetic fields. Thus, the condition $\omega = \omega_{ce}$ is achieved in a thin surface within the discharge volume. This surface is referred to as a ECR layer region, or surface and is shown in FIGS. 1 to 9 as 60. Thus, condition (2) is achieved in a surface within the discharge. However, for ECR acceleration all three of the above conditions must be met. $\nu_e < < \omega$ is achieved at low pressures. The remaining condition, i.e. condition (1), requires that the microwave electric field have a component perpendicular to the magnetic field. This invention is concerned with the optimal adjustment of the microwave electric field with respect to the static magnetic field on and around an ECR surface. This invention uses cavity modes where field patterns are spatially adjusted so that the electric field is everywhere perpendicular to B on an ECR surface and also chooses modes where the electric field intensity is concentrated on a ECR surface.

Thus, the $TE_{nlp}$ modes are chosen because their field strengths are the most intense on the outer circumference of the cavity where n is ½ of the number of electric field cusps and p is the number of standing ½ wave lengths along the axis of the cavity. These modes have their highest field strengths exactly where the ECR surfaces are located. In addition, this mode pattern can be adjusted with respect to the static magnetic fields so that the electric field is everywhere perpendicular to the magnetic field on the ECR layer. This produces efficient microwave coupling over and around the entire ECR layer. For optimal matching between the electric field cusps and magnetic field cusps, 2n magnets are needed for $TE_{nlp}$ excitation.

The three above mentioned conditions are necessary for ECR acceleration of electrons, and are usually achieved at low pressures in a physical volume of the discharge around the ECR surface. This volume is referred to as the ECR acceleration volume, i.e. $V_{ECR}$.

The electrons which are accelerated in the ECR volume move throughout the discharge volume and excite and ionize the neutral gas ions. Thus, if the mean free path of the electrons is much larger than the discharge dimensions, then ions and excited species are created throughout the discharge volume and some electrons move into and out of the ECR volume receiving multiple accelerations between collisions. The microwave power absorption by the electron gas takes place primarily within a specific localized ECR volume (or surface) inside of the discharge. Therefore in order to produce efficient microwave energy transfer to the plasma, the electric field should be focused on and must be controlled in the ECR volume. In addition, if discharge uniformity is important, the ECR electron accelerating volumes should be adjusted in size and position to produce a uniform discharge.

SPECIFIC DESCRIPTION

FIGS. 1 to 4 show the preferred improved plasma generating apparatus of the present invention. The basic construction of the apparatus without the magnet mountings is described in U.S. Pat. Nos. 4,507,588 and 4,727,293. It will be appreciated that various non-magnetic materials can be used in the construction of the apparatus, such as copper, brass, aluminum, silver, gold, platinum, non-magnetic stainless steel and the like.

The apparatus preferably includes copper or brass cylinder 10 forming the microwave cavity 11 with a copper or brass sliding short 12 for adjusting the length of the cavity 11. Silver plated copper brushes 13 electrically contact the cylinder 10. The brushes 13 are provided entirely around the circumference of the sliding short 12; however, in FIG. 1 only two are shown. Moveable excitation probe or antenna 14 provides impedance tuning of the microwave energy in the cavity 11. The probe 14 is mounted in cavity 11 by brass or copper conduit 21. Radial penetration of the probe 14 into the cavity 11 varies the coupling to the plasma in the cavity 11. Sliding short 12 is moved back and forth in cavity 11 to aid in tuning the microwave by rods 22 using conventional adjustment means (not shown) such as described in U.S. Pat. No. 4,507,588.

A quartz dish or chamber 15 preferably shaped like a round bottomed flask defines the plasma region 16 along with a stainless steel base 30. Gas is fed by tube 19 to annular ring 18 to inlets 20 and then flows into the plasma region 16. Optionally a cooling line 42 is provided which cools the base 30. The cylinder 10 slides onto the base 30 and is held in place on a ring 30a on base 30 by copper or brass ring 10a secured to the cylinder 10. The ring 10a is held in place on base 30 by copper or brass bolts 33. This construction allows the base 30 and chamber 15 to be removed from the cylinder 10. A vacuum chamber 35 is connected to the base 30 and provides the vacuum in region 16 by vacuum means (not shown).

In the improved plasma apparatus, the chamber 15 and plasma region 16 are surrounded by magnets 34. In the preferred embodiment, six (6) or more equally spaced magnets 34 surround the chamber 15 around axis a—a. The magnets 34 provide interconnected magnetic field cusps 16a in the plasma region 16 of the chamber 15 as shown in FIG. 2A. The magnets 34 reduce particle diffusion losses from region 16 inside the chamber 15. The magnetic field strength decreases as the longitudinal axis a—a and center of the plasma region 16 is approached because of the positioning of the magnets 34.

The magnets 34 are mounted on a high magnetic permeability (iron) ring 37 around the ring 31 and held in place by magnetic attraction. Gases pass out the opening or nozzle 41 from the plasma region 16. The nozzle 41 is optional and need not be used.

FIG. 2 shows the higher electric field cusps 16b used for electron cyclotron resonance. FIG. 2A shows the magnetic field cusps 16a. FIG. 5 shows the cusps 16a and 16b overlapping. FIG. 4 shows the various higher electromagnetic fields which can be selected.

FIGS. 3 and 3A show a rectangular cross-sectioned applicator 50 defining a microwave cavity 51 and with magnets 52 around the inside of the applicator 50 shielded by plates 53. The electromagnetic field cusps 51a for a high mode ($TE_{42}$) are shown in FIG. 3. FIG. 3A shows the magnetic field cusps 51b. As can be seen the field cusps 51a 51b overlap so as to provide improved ECR.

FIG. 6 shows the support 45 for sample or substrate 46. The support is connected to rf or dc bias 47 to accelerate ions to the substrate. FIG. 7 shows a shorter support 45a for sample 46 which is connected to bias 47. FIG. 8 shows a grid 48 which is used to aid in extracting ions from the cavity 16 to impinge on substrate 46. FIG. 9 shows the angle $\phi$ for movement of the magnets 34 relative to the position of the probe 14 which is shown by an arrow to provide the intersecting fields 16a and 16b. FIGS. 10 and 11 show spaced apart ring magnets 50 and 51 as an alternative embodiment. The magnetic field is between the ring magnets 50 and 51. In this configuration the ECR region is uniform around axis a—a and the field patterns are of the type shown, such as the $TE_{onp}$ modes. FIG. 12 shows the usual alignment of the electromagnetic fields 16b relative to the probe 14. The magnets 50 and 51 or 34 are moved so that the electric field is perpendicular to the magnetic field on an ECR surface.

In the preferred applicator as shown in FIGS. 1, 2 and 5 to 9, an 8" (20.32 cm) cylindrical discharge volume 11 is surrounded by fourteen magnets 34 with alternating poles. The magnetic fields are produced by pairs of 2 inch (5.08 cm) square rare earth magnets each with a pole face free magnetic field strength in excess of 3 kG. Thus, these magnets produce a strong multicusp magnetic field adjacent to the inner surface of the eight inch diameter discharge. An ECR surface, which requires a 875 G field strength for 2.45 GHz excitation, is produced in the discharge volume. This surface, which is shown as a solid surface (or volume) in FIGS. 5 to 9, is an undulating curved thin volume located approximately 2-3½ cm from the cylindrical wall of the chamber 15.

The discharge volume of FIG. 1 can be excited with many TE or TM circular waveguide modes. The electromagnetic field patterns of a number of TE and TM circular waveguide modes are shown in FIG. 4. A careful examination of both the TE and TM modes reveals that almost any mode will produce an electric field that is perpendicular to the static magnetic field in some part of the ECR volume shown in FIG. 1. However, some modes can produce a more complete and uniform excitation of the ECR volume, i.e. excitation completely around the discharge circumference. A specific mode which can produce an excellent overlap between the static magnetic field pattern and the excited electromagnetic field pattern is the $TE_{71}$ mode. This mode has two features that are similar to the multicusp static magnetic field pattern: (1) the strongest fields (electric in this case) are located adjacent to the outer boundary of the wall of the chamber 15, and (2) the mode pattern has fourteen electric field cusps. Thus strong electric fields can be positioned so that the electric and magnetic fields are everywhere perpendicular inside the ECR volume producing a uniform layer of ECR acceleration. The input gas feed ring 18 has fourteen small gas inlet holes forcing the input gas to flow through the ECR excitation volume mixing the unionized feed gas with the accelerated electrons. This method of gas feed causes the input gas to be uniformly and efficiently ionized around the discharge.

This method of ECR discharge excitation is particularly useful when attempting to create large diameter discharges (>5 inches (12.7 cm)) with 2.45 GHz. For example, waveguides with 12-18 inch (30.48 to 45.72 cm) diameters can be used to excite a $TE_{71}$ mode which is incident on a 6-12 inch (15.24-30.48 cm) discharge. Waveguide applicators will produce the correct coupling of the $TE_{71}$ mode to the cylindrical discharge. However, if the $TE_{71}$ mode is excited, many more lower order TE and TM modes will also exist. Their presence will produce nonuniform, undesirable ECR volume excitations. Thus a tunable cylindrical cavity applicator has a number of advantages. First, the internally tunable cavity can help match any waveguide mode to the cylindrical discharge. Secondly, by adjusting the cavity length the unwanted mode excitations can be prevented. Thus, it is possible to single mode excite and control the desired electric field patterns for optimal ECR operation.

The ECR discharge loaded cavity is tuned and matched to a $TE_{nlp}$ resonance with a specific input power. Then as the input power is slowly increased and/or decreased the discharge loaded cavity is retuned to a match in the $TE_{nlp}$ mode. Thus the power absorbed in the ECR volume can be carefully varied and controlled.

An essential part of the present invention is to rotate the $TE_{nlp}$ mode pattern with respect to the angle $\phi$ of the cylindrical cavity such that the static magnetic fields are everywhere perpendicular to the electrical fields. This is done by physically rotating the magnets 34 with respect to the probe 14.

The magnets preferably have a field strength between about 0.01 and 5 Tesla. The radio frequency is between about 400 Megahertz and 10 Gigahertz, preferably 915, 2.45 and approved heating frequencies. The pressure in the chamber is preferably between about $10^{-1}$ and $10^{-6}$ Torr.

It is intended that the foregoing description be only illustrative of the present invention and that the present invention be limited only by the hereinafter appended claims.

We claim:

1. A plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a probe connected to and extending inside the coupler for coupling the radio frequency waves to the coupler, wherein the radio frequency wave applied to the coupler creates and maintains the plasma at reduced pressures perpendicular to and surrounding the central longitudinal axis in the chamber, the improvement which comprises:
   (a) spaced apart magnet means mounted on the apparatus around the longitudinal axis of the chamber with N and S poles so as to create static magnetic field cusps in the chamber between the poles which aid in confining the plasma in the chamber;
   (b) gas supply means for providing a gas in the chamber which is ionized to form the plasma in the chamber; and
   (c) a radio frequency wave generator which generates multiple higher mode microwave electric field cusps in the chamber so as to provide the electric field cusps with the magnetic field cusps from the magnet means which overlap in the chamber to provide the electric field essentially perpendicular to the static magnetic field completely over an electron cyclotron resonance region in the plasma adjacent to the magnet means around the longitudinal axis of the chamber in operation of the apparatus wherein there are an even number of magnetic cusps and an even number of at least six said magnet means around the chamber, the number of electric field cusps equals the number of the magnetic field cusps and the mode is selected from $TE_{nlp}$, wherein n is one-half of the number of the electric field cusps and p is the number of standing one-half wave lengths along the axis of the cavity and wherein n is at least b 3.

2. The apparatus of claim 1 wherein the generator has a variable power supply which is used to vary the radio frequency waves in the coupler.

3. The apparatus of claim 1 wherein the magnet means are permanent rare earth magnets.

4. The apparatus of claim 1 wherein a nozzle means is provided in the chamber for the plasma along the longitudinal axis leading to a vacuum chamber mounted adjacent to the electrically insulated chamber for providing the reduced pressures in the electrically insulated chamber and wherein a support for a substrate to be exposed to the plasma is provided in the vacuum chamber along the longitudinal axis beneath the nozzle means.

5. The apparatus of claim 1 wherein the magnet means are spaced apart magnetic rings along the axis of the chamber which provide the magnetic field cusps.

6. A plasma generating apparatus which comprises:
   (a) a plasma source employing a radio frequency, including UHF or microwave, wave coupler which is metallic and non-magnetic and in the shape of a hollow cavity which can be excited in one or more TE or TM modes of resonance;
   (b) an electrically insulated chamber having a central longitudinal axis and mounted in the coupler;
   (c) spaced apart permanent magnets mounted around the longitudinal axis of the chamber on a ring of high permeability magnetic material with N and S poles so as to create static magnetic field cusps in the chamber between the poles which aid in confining the plasma in the chamber;
   (d) gas supply means for providing a gas which is ionized to form the plasma in the insulated chamber;
   (e) a movable antenna means connected to and extending inside the coupler for coupling the radio frequency waves to the coupler;
   (f) movable plate means as a sliding short in the cavity which is non-magnetic and metallic mounted perpendicular to the axis and movable towards and away from the chamber;
   (g) vacuum means for providing a reduced pressure in the chamber;
   (h) a radio frequency wave generator which generates multiple higher mode microwave electric field cusps in the chamber;
   wherein movement of the plate means and the antenna means in the coupler achieves the selected TE or TM mode of resonance of the radio frequency wave in the coupler and varies the resonance of the mode, wherein the radio frequency wave applied to the coupler creates and maintains the plasma at the reduced pressure perpendicular to and surrounding the central longitudinal axis in the chamber and wherein the cavity has a length along the longitudinal axis determined by the moveable plate means such that the mode creates the electric field cusps which are essentially perpendicular to the magnetic field cusps and a uniform electron cyclotron resonance region is created and maintained in the chamber adjacent to the magnets around the longitudinal axis of the chamber in the operation of the apparatus wherein there are an even number of magnetic cusps and an even number of at least six said magnets around the chamber, the number of electric field cusps equals the number of the magnetic field cusps and the mode is selected from $TE_{nlp}$ wherein n is one-half of the number of the electric field cusps and p is the number of standing one-half wave lengths along the axis of the cavity and wherein n is at least b 3.

7. The apparatus of claim 6 wherein the generator has a variable power supply which is used to couple the radio frequency waves in the coupler to maintain the mode with the electromagnetic fields adjacent to each magnet when a plasma is in the chamber.

8. The apparatus of claim 6 wherein a nozzle means is provided in the electrically insulated chamber confining the plasma along the axis leading to a vacuum chamber for providing the reduced pressure in the electrically insulated chamber and wherein a support for a substrate to be exposed to the plasma is provided in the vacuum chamber along the axis of the vacuum chamber beneath the nozzle means.

9. A method for creating a plasma which comprises:
   (a) providing a plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a probe connected to and extending inside the coupler for coupling the radio frequency waves to the coupler, wherein the radio frequency wave applied to the coupler creates and maintains the plasma at reduced pressures perpendicular to and surrounding the central longitudinal axis in the chamber, the improvement which comprises: spaced apart magnet means mounted on the apparatus around the longitudinal axis of the chamber with N and S poles so as to create static magnetic field cusps in the chamber between the poles which aid in confining the plasma in the chamber; gas supply means for providing a gas in the chamber; which is ionized to form the plasma in the chamber; and a radio frequency wave generator which generates multiple higher mode microwave electric field cusps in the chamber so as to provide the electric field cusps with the magnetic field cusps from the magnet means which overlap in the chamber to provide the electric field essentially perpendicular to the static magnetic field completely over an electron cyclotron resonance region in the plasma in the chamber in operation of the apparatus; and (b) creating a plasma in the chamber by introducing the gas into the chamber from the gas supply means at reduced pressure and providing the electron cyclotron resonance region adjacent to the magnet means around the longitudinal axis of the chamber wherein there are an even number of magnetic cusps and an even number of at least six said magnet means around the chamber, the number of electric field cusps equals the number of the magnetic field cusps and the mode is selected from $TE_{nlp}$, wherein n is one-half of the number of the electric field cusps and p is the number of standing one-half wave lengths along the axis of the cavity and wherein n is at least 3.

10. The method of claim 9 wherein the pressure is between about $10^{-1}$ and $10^{-6}$ Torr.

11. The method of claim 9 wherein the chamber has a nozzle means and wherein the plasma is moved through the nozzle means from the chamber.

12. The method of claim 9 wherein a substrate to be treated upon is exposed to the plasma inside or outside of the chamber.

13. The method of claim 9 wherein the magnet means are rare earth magnets having a magnetic field strength between about 0.01 and 0.5 Tesla and wherein the radiowave frequency is between about 400 Megahertz and 10 Gigahertz.

14. The method of claim 13 wherein the magnets have a magnetic field with a strength of about 875 gauss in an ECR region of the plasma and the frequency is about 2.45 Gigahertz.

15. The method of claim 9 wherein the magnet means are spaced apart magnetic rings along the axis of the chamber which provide the magnetic field cusps.

16. A method for creating a plasma which comprises:
(a) providing an apparatus which comprises a plasma source employing a radio frequency, including UHF or microwave, wave coupler which is metallic and non-magnetic and in the shape of a hollow cavity which can be excited in one or more TE or TM modes of resonance; and electrically insulated chamber having a central longitudinal axis and mounted in the coupler; spaced apart permanent magnets mounted around the longitudinal axis of the chamber on a ring of high permeability magnetic material with alternate N and S poles so as to create magnetic field cusps in the chamber between the poles which aid in confining the plasma in the chamber; gas supply means for providing a gas which is ionized to form the plasma in the insulated chamber; a movable antenna means connected to and extending inside the coupler for coupling the radio frequency waves to the coupler; movable plate means as a sliding short in the cavity which is non-magnetic and metallic mounted perpendicular to the axis and movable towards and away from the chamber; vacuum means for providing a reduced pressure in the chamber; and a radio frequency wave generator which generates higher mode microwave electric field cusps in the chamber so as to provide the electrical field cusps with the magnetic field cusps from the magnets which overlap to provide the electric field essentially perpendicular to the magnetic field completely over an electron cyclotron resonance region in the plasma in the chamber in operation of the apparatus;

(b) providing a plasma in the chamber by introducing a gas in the chamber at reduced pressures; and (c) adjusting the movable plate means to maintain the electric field cusps in the chamber with microwave electric field and magnetic cusps being perpendicular to each other, thereby creating and maintaining the electron cyclotron resonance region adjacent to the longitudinal axis of the electrically insulated chamber wherein there are an even number of at least six said magnets around the cavity, the number of electric field cusps equals the number of the magnetic field cusps and wherein the mode is selected from $TE_{nlp}$ wherein n is one-half of the number of the electric field cusps and p is the number of standing one-half wave lengths along the axis of the cavity and wherein n is at least 3.

17. The method of claim 16 wherein the reduced pressures are between about $10^{-1}$ and $10^{-6}$ Torr.

18. The method of claim 16 wherein the chamber has a nozzle means and wherein the plasma is moved through the nozzle means from the chamber.

19. The method of claim 16 wherein a substrate to be treated upon is exposed to the plasma inside or outside of the chamber.

20. The method of claim 16 wherein the magnets are rare earth magnets having a field strength between about 0.01 and 0.5 Tesla and wherein the frequency is between about 400 Megahertz and 10 Gigahertz.

21. The method of claim 16 wherein the magnets have a field strength of about 875 gauss in the ECR region of the plasma and the frequency is about 2.45 Gigahertz.

* * * * *

UNITED STATES PATENT AND TRADEMARK OFFICE
CERTIFICATE OF CORRECTION

PATENT NO. : 5,081,398
DATED : January 14, 1992
INVENTOR(S) : Jes Asmussen and Jeffrey A. Hopwood It is certified that error appears in the above—identified patent and that said Letters Patent is hereby corrected as shown below:

Column 5, line 29, "51a 51b" should read --51a and 51b--.

Column 5, line 54, "earthmmagnets" should be --earth magnets--.

Column 7, line 43 (Claim 1), "at least b 3" should read --at least 3--.

Column 8, line 46 (Claim 6), "at least b 3" should read --at least 3--.

Signed and Sealed this

Twenty-fifth Day of May, 1993

Attest:

MICHAEL K. KIRK

*Attesting Officer*  *Acting Commissioner of Patents and Trademarks*